United States Patent
Sankaran et al.

(10) Patent No.: US 9,166,270 B2
(45) Date of Patent: Oct. 20, 2015

(54) BALUN WITH INTEGRATED DECOUPLING AS GROUND SHIELD

(71) Applicant: Texas Instruments Incorporated, Dallas, TX (US)

(72) Inventors: Swaminathan Sankaran, Allen, TX (US); Brian P. Ginsburg, Allen, TX (US); Vijay B. Rentala, Plano, TX (US); Srinath M. Ramaswamy, Murphy, TX (US); Eunyoung Seok, Plano, TX (US); Baher Haroun, Allen, TX (US); Bradley A. Kramer, Plano, TX (US); Hassan Ali, Murphy, TX (US); Nirmal C. Warke, Irving, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 292 days.

(21) Appl. No.: 13/683,735

(22) Filed: Nov. 21, 2012

(65) Prior Publication Data

US 2014/0139297 A1    May 22, 2014

(51) Int. Cl.
*H01P 5/10* (2006.01)
*H05K 1/02* (2006.01)
*H03H 1/00* (2006.01)

(52) U.S. Cl.
CPC ............... *H01P 5/10* (2013.01); *H03H 1/0007* (2013.01); *H05K 1/0216* (2013.01)

(58) Field of Classification Search
CPC ........ H01P 5/10; H04B 15/00; H04B 15/005; H04B 15/02; H05K 1/0216; H03H 1/0007
USPC .................................................. 333/25, 26, 12
See application file for complete search history.

(56) References Cited

U.S. PATENT DOCUMENTS 5,015,972 A * 5/1991 Cygan et al. ................... 333/32
8,476,687 B2 7/2013 Ginsburg et al.

* cited by examiner

*Primary Examiner* — Benny Lee
*Assistant Examiner* — Albens Dieujuste
(74) *Attorney, Agent, or Firm* — John R. Pessetto; Charles A. Brill; Frank D. Cimino

(57) ABSTRACT

An apparatus is provided. Transmission line cells are formed in a first region. A first metallization layer is formed over the transmission line cells within a portion of the first region. At least a portion of the first metallization layer is electrically coupled to the plurality of transmission line cells. A second metallization layer is formed over the first metallization layer with an interconnect portion, and overlay portion, and a first balun. The interconnect portion at least partially extends into the first region, and the overlay portion is within the first region. The first balun winding is electrically coupled to the overlay portion and partially extends into a second region. The first region partially surrounds the second region. A third metallization layer is formed over the second metallization layer having a second balun winding within the second region, where the second winding is generally coaxial with the first balun winding.

16 Claims, 5 Drawing Sheets

BALUN WITH INTEGRATED DECOUPLING AS GROUND SHIELD

TECHNICAL FIELD

The invention relates generally to transformer and, more particularly, to balun with integrated decoupling as a ground shield.

BACKGROUND

Transmission lines employing transmission line units or elements within integrated circuits (ICs) are well-known. Typically, different heights for these transmission line units can vary the characteristics of the cell (and transmission line). Namely, the impedance is inversely proportional to the height. However, there is typically a tradeoff between impedance and space (layout) specifications. Additionally, many components, such as balun, use different input impedances.

One example of a conventional transmission line unit can be seen in U.S. patent application Ser. No. 12/888,208, which is entitled "LOW IMPEDANCE TRANSMISSION LINE," which was field on Sep. 22, 2010, and which is incorporated by reference herein for all purposes. As shown, a transmission line is coupled to a balun, but this transmission line is substantially linear and is spaced apart from the balun so as to not interfere with the characteristics. As a result, area is wasted. Therefore, there is a desire for a transmission line for use with a balun that does not interfere with its characteristics and uses less area.

SUMMARY

In accordance with the present invention, an apparatus is provided. The apparatus comprises a plurality of transmission line cells formed in a first region; a first metallization layer formed over the plurality of transmission line cells within a portion of the first region, wherein at least a portion of the first metallization layer is electrically coupled to the plurality of transmission line cells; a second metallization layer formed over the first metallization layer, wherein the second metallization layer includes: an interconnect portion that at least partially extends into the first region; an overlay portion within the first region; a first balun winding that is electrically coupled to the overlay portion and that partially extends into a second region, wherein the first region partially surrounds the second region; and a third metallization layer formed over the second metallization layer having a second balun winding within the second region, wherein the second winding is generally coaxial with the first balun winding.

In accordance with the present invention, the first region includes an opening, and wherein the first balun winding includes first and second leads that extend through the opening.

In accordance with the present invention, the overlay portion further comprises a first overlay portion and a second overlay portion, and wherein the interconnect portion is located between the first and second overlay portions.

In accordance with the present invention, the first balun winding further comprises a third lead that is coupled to the second overlay portion and that is opposite first and second leads.

In accordance with the present invention, the interconnect portion further comprises a first interconnect portion and a second interconnect portion.

In accordance with the present invention, the second balun winding further comprises: a fourth lead that is coupled to the first interconnect portion; and a fifth lead that is coupled to the second interconnect portion.

In accordance with the present invention, an apparatus is provided. The apparatus comprises a first region; a second region, wherein the first region substantially surrounds at least a portion of the second region, and wherein the first region includes an opening; a plurality of transmission line cells formed in the first region; a first metallization layer having a plurality of portions formed in the first region that are electrically coupled to the plurality of transmission line cells; a second metallization layer formed over the first metallization layer, wherein the second metallization layer includes: an interconnect portion that at least partially extends into the first region; an overlay portion within the first region; a first balun winding that is electrically coupled to the overlay portion and that partially extends into a second region, wherein the first region partially surrounds the second region; and a third metallization layer formed over the second metallization layer having a second balun winding within the second region, wherein the second winding is generally coaxial with the first balun winding.

In accordance with the present invention, the interconnect portion further comprises a first interconnect portion and a second interconnect portion.

In accordance with the present invention, the second balun winding further comprises: a first lead that is coupled to the first interconnect portion; and a second lead that is coupled to the second interconnect portion.

In accordance with the present invention, the first and second leads point in a first direction, and wherein the first balun winding includes first and second leads that extend through the opening and point in a second direction, and wherein the first direction is generally perpendicular to the second direction.

In accordance with the present invention, the overlay portion further comprises a first overlay portion and a second overlay portion, and wherein the interconnect portion is located between the first and second overlay portions.

In accordance with the present invention, the first balun winding further comprises a third lead that is coupled to the second overlay portion and that points in a third direction, wherein the third direction is generally perpendicular to the first direction and opposite the second direction.

In accordance with the present invention, an apparatus is provided. The apparatus comprises a balun having: a first winding formed from a first portion of a first metallization layer, wherein the first winding has first and second leads pointing in a first direction and a third lead pointing in a second direction, and wherein the second direction is opposite the first direction; and a second winding formed from at least a portion of a second metallization layer, wherein the second winding has fourth and fifth leads pointing in a third direction, wherein the third direction is generally perpendicular to the first and second directions, and wherein the second winding is formed over and generally coaxial with the first winding; a transmission line formed along at least a portion of the periphery of the balun, wherein the transmission line includes a plurality of transmission line cells; a first conductive plane formed from at least a portion of a third metallization layer that extends over the transmission line, wherein at least a portion of the first conductive plane is electrically coupled to the transmission line; a second conductive plane formed from a second portion of the second metallization layer, wherein the second conductive plane extends over at least a portion of the first conductive plane, and wherein the second conductive plane is electrically coupled to the third lead; a first interconnect formed from a third portion of the second metallization layer, wherein the first interconnect is electrically coupled to the fourth lead; and a second interconnect formed from a fourth portion of the second metallization layer, wherein the second interconnect is electrically coupled to the first conductive plane and the fifth lead.

In accordance with the present invention, the apparatus further comprises: a first set of vias coupled between the second interconnect and the first conductive plane; and a second set of vias coupled between the fifth lead and the second interconnect.

In accordance with the present invention, the first, second and third metallization layers are formed of copper or aluminum.

In accordance with the present invention, the first and second set of vias is formed of tungsten.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
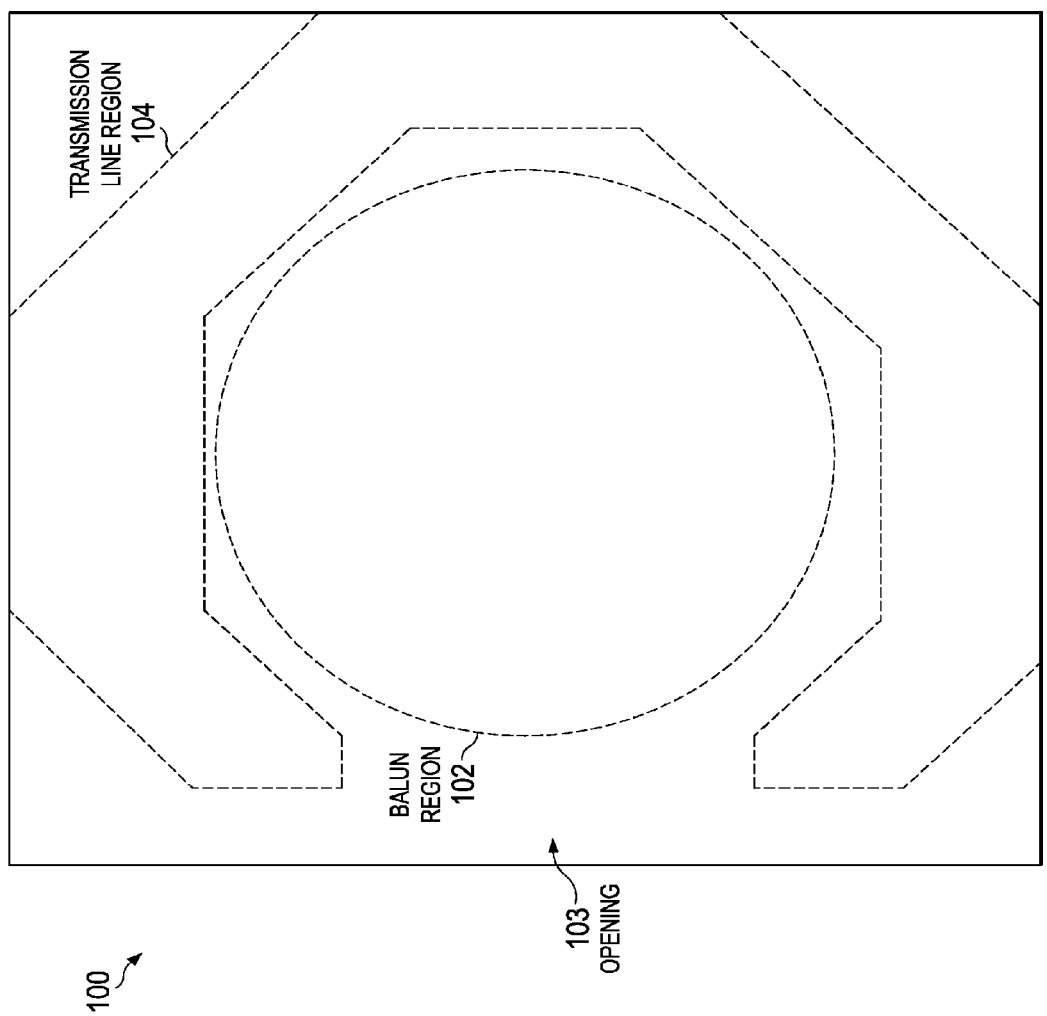
FIG. 1 is a diagram of an example of a layer of a transformer comprising a transmission line region and a balun region, in accordance with the present invention.

Refer now to the drawings wherein depicted elements are, for the sake of clarity, not necessarily shown to scale and wherein like or similar elements are designated by the same reference numeral through the several views.

In FIGS. 1-5, an example of a transformer 100 can be seen. This transformer 100 includes a transmission line and balun that are, respectively, formed within transmission line region 104 and balun region 102. The transmission line generally forms a high-loss, low impedance termination for a terminal of the balun. As shown in this example, the transmission line region 104 is formed along a portion of the periphery of the balun region 102 so as to substantially surround it. This transmission line region 104, in this example, does not completely surround the balun region 102 as there is an opening 103.

Figure 2:
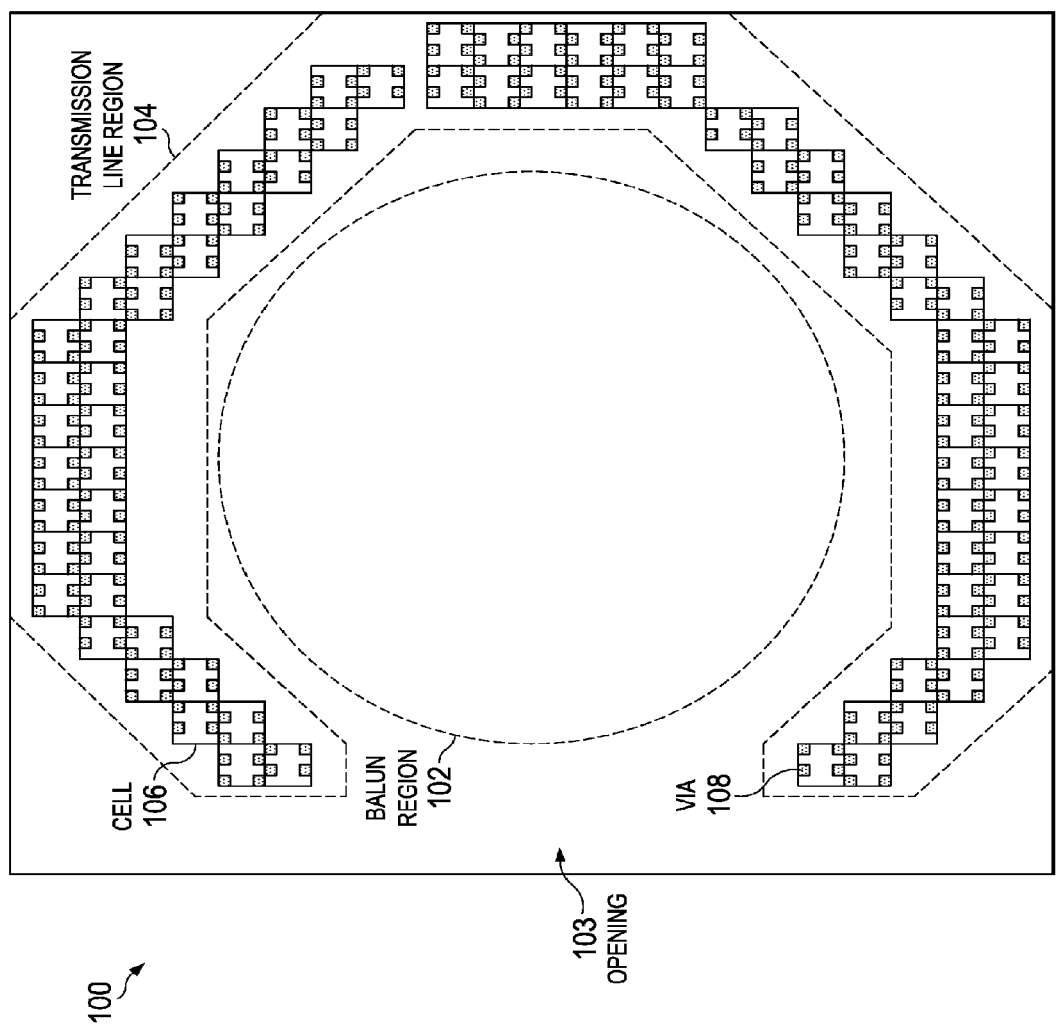
FIG. 2 is a diagram of an example of a layer of a transformer, comprising a transmission line region and a balun region, wherein the transmission line region is comprised of cells and vias, in accordance with the present invention.
Figure 3:
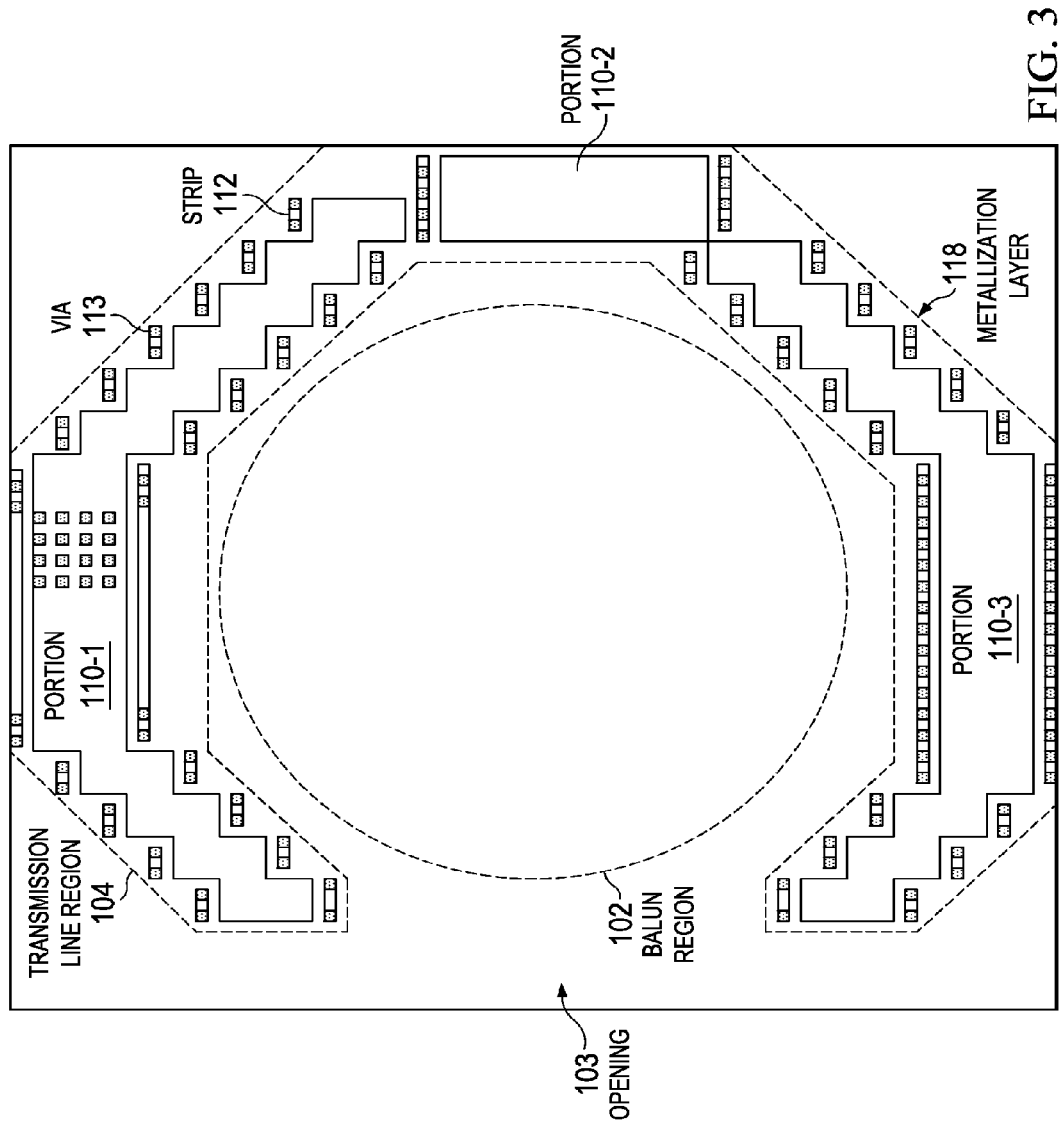
FIG. 3 is a diagram of an example of a layer of a transformer, comprising a transmission line region and a balun region, wherein the transmission line region is comprised of cells and vias, which are electrically coupled to a conductive plane formed from a metallization layer, in accordance with the present invention.

As can be more clearly seen in FIG. 2, the transmission line is generally formed of cells 106. These cells are more fully described in U.S. Pat. No. 8,476,687, which is entitled "LOW IMPEDANCE TRANSMISSION LINE," which was filed on Sept. 22, 2010, and which is incorporated by reference herein for all purposes. These cells include vias 108 (which can, for example, be formed of tungsten) that allow them to be electrically coupled to a conductive plane (which can be seen in greater detail in FIG. 3). This conductive plane can be formed from metallization layer 114 (which can, for example, be formed of aluminum or copper) and can be formed from portions 110-1 to 110-3 and strips 112. Formed over the metallization layer 114, as shown in this example, are vias 113. It is this metallization layer 114 that can, in part, function as a ground plane.

Figure 4:
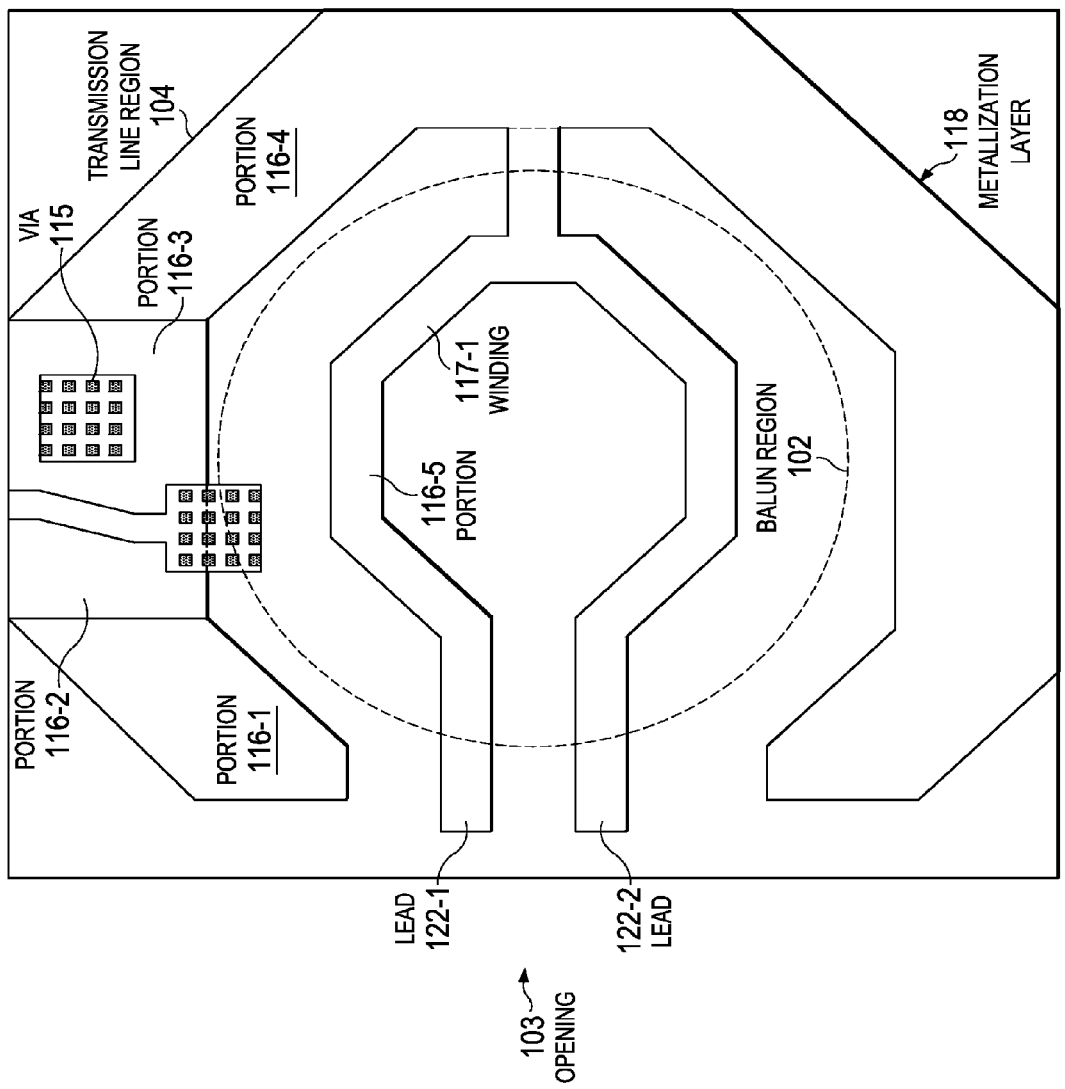
FIG. 4 is a diagram of an example of a layer of a transformer, comprising a transmission line region and a balun region, wherein the transmission line region is comprised of an overlay portion and an interconnect portion formed on a metallization layer, in accordance with the present invention.

Above metallization layer 114 (as can be seen in FIG. 4), metallization layer 118 can be formed. This metallization layer 118 can also be, for example, of aluminum or copper similar to metallization layer 114. One difference between metallization layers 118 and 114 is that metallization layer 118 extends beyond the transmission line region 104 and into the balum region 102. Within the transmission line region 104, the metallization layer 118 has an overlay portion (which can be comprised of portions 116-1 and 116-4) and a interconnect portion (which can be comprised of portions 116-2 and 116-3). Portion 116-3, in this example, is located entirely within the transmission line region 104 and is coupled to portion 116-4 through vias 115. Portion 116-2, in this example, extends into both the transmission line region 104 and the balun region 102. Within the balun region 104, portion 116-5 of metallization layer 118 can form a winding 117-1 with terminals or leads 122-1 and 122-2 (which can be differential terminals) that extend through the opening 103 in the transmission line region 102. Opposite the leads 122-1 and 122-2 is another lead that is coupled with portion 116-5 to portion 116-4.

Figure 5:
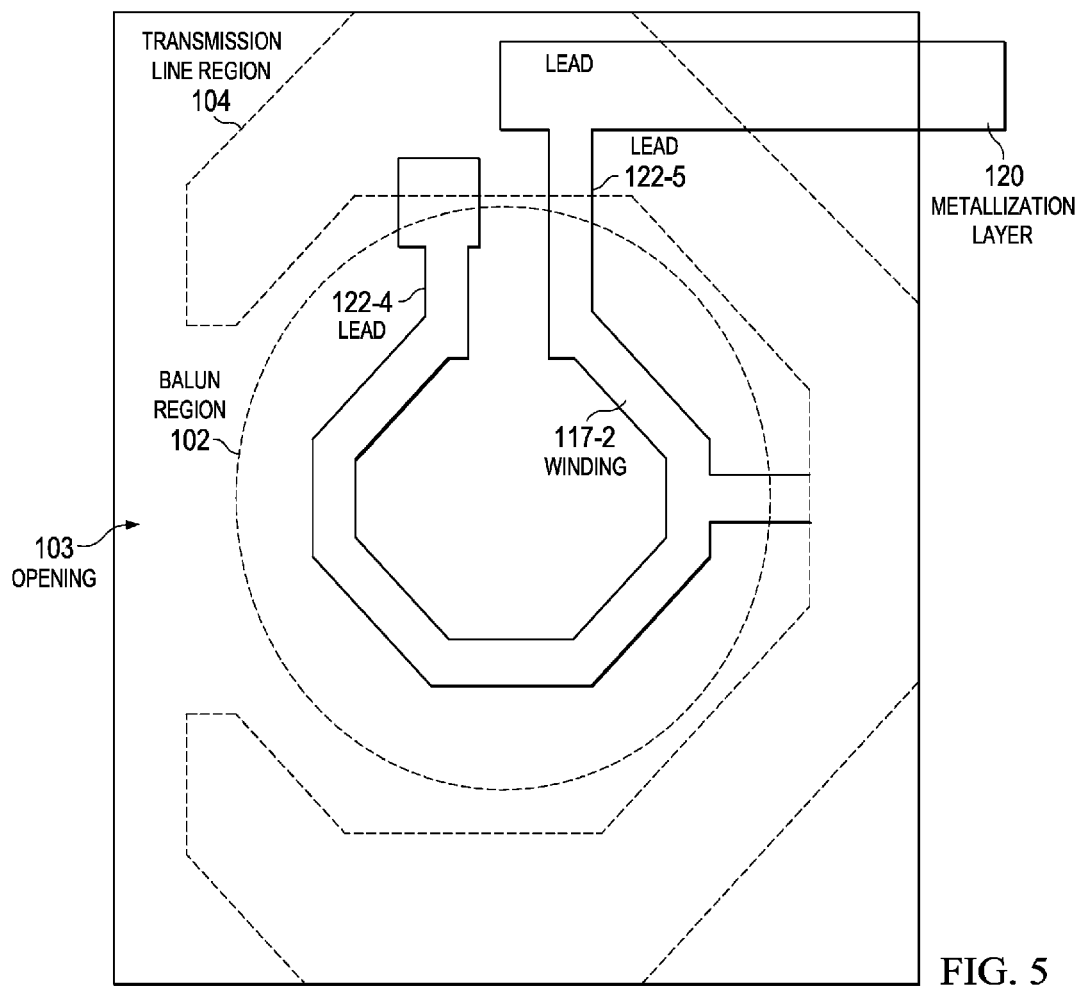
FIG. 5 is a diagram of an example of a layer of a transformer, comprising a transmission line region and a balun region, wherein the transmission line region is comprised of a metallization layer forming a winding within the balun region and leads from the winding extends from the balun region into the transmission line region, in accordance with the present invention.

Metallization layer 120 (as shown in FIG. 5) can then be formed over metallization layer 118. As shown in this example, the metallization layer 120 is primarily located within the balun region so as to form a winding of a balun. The winding 117-2, formed by metallization layer 120 in this example, is generally coaxial with the winding 117-1 formed by portion 116-5. As shown, there are leads 122-4 and 122-5 that extend from the balun region 102 to the transmission line region 102. Lead 122-5 is coupled to portion 116-3 (and the underline ground plane), and lead 122-4 can be coupled to portion 116-2 through vias 115, allowing a single-ended signal to be propagated through winding 117-2. It should also be noted that interposed, between the metallization layers 114, 118, and 120 and the transmission line, there can be interlayer dielectric layers (which can, for example, be formed of silicon dioxide).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of transmission line cells formed in a first region;
   a first metallization layer formed over the plurality of transmission line cells within a portion of the first region, wherein at least a portion of the first metallization layer is electrically coupled to the plurality of transmission line cells;
   a second metallization layer formed over the first metallization layer, wherein the second metallization layer includes:
   an interconnect portion that at least partially extends into the first region;
   an overlay portion within the first region;
   a first balun winding that is electrically coupled to the overlay portion and that partially extends into a second region, wherein the first region partially surrounds the second region; and
   a third metallization layer formed over the second metallization layer having a second balun winding within the second region, wherein the second balun winding is generally coaxial with the first balun winding.

2. The apparatus of claim 1, wherein the first region includes an opening, and wherein the first balun winding includes first and second leads that extend through the opening.

3. The apparatus of claim 2, wherein the overlay portion further comprises a first overlay portion and a second overlay portion, and wherein the interconnect portion is located between the first and second overlay portions.

4. The apparatus of claim 3, wherein the first balun winding further comprises a third lead that is coupled to the second overlay portion and that is opposite first and second leads.

5. The apparatus of claim 4, wherein the interconnect portion further comprises a first interconnect portion and a second interconnect portion.

6. The apparatus of claim 5, wherein the second balun winding further comprises:
   a fourth lead that is coupled to the first interconnect portion; and
   a fifth lead that is coupled to the second interconnect portion.

7. An apparatus comprising:
   a first region;
   a second region, wherein the first region substantially surrounds at least a portion of the second region, and wherein the first region includes an opening;
   a plurality of transmission line cells formed in the first region;
   a first metallization layer having a plurality of portions formed in the first region that are electrically coupled to the plurality of transmission line cells;
   a second metallization layer formed over the first metallization layer, wherein the second metallization layer includes:
   an interconnect portion that at least partially extends into the first region;
   an overlay portion within the first region;
   a first balun winding that is electrically coupled to the overlay portion and that partially extends into a second region, wherein the first region partially surrounds the second region; and
   a third metallization layer formed over the second metallization layer having a second balun winding within the second region, wherein the second winding is generally coaxial with the first balun winding.

8. The apparatus of claim 7, wherein the interconnect portion further comprises a first interconnect portion and a second interconnect portion.

9. The apparatus of claim 8, wherein the second balun winding further comprises:
   a first lead that is coupled to the first interconnect portion; and
   a second lead that is coupled to the second interconnect portion.

10. The apparatus of claim 9, wherein the first and second leads point in a first direction, and wherein the first balun winding includes first and second leads that extend through the opening and point in a second direction, and wherein the first direction is generally perpendicular to the second direction.

11. The apparatus of claim 10, wherein the overlay portion further comprises a first overlay portion and a second overlay portion, and wherein the interconnect portion is located between the first and second overlay portions.

12. The apparatus of claim 11, wherein the first balun winding further comprises a third lead that is coupled to the second overlay portion and that points in a third direction, wherein the third direction is generally perpendicular to the first direction and opposite the second direction.

13. An apparatus comprising:
   a balun having:
   a first winding formed from a first portion of a first metallization layer, wherein the first winding has first and second leads pointing in a first direction and a third lead pointing in a second direction, and wherein the second direction is opposite the first direction; and
   a second winding formed from at least a portion of a second metallization layer, wherein the second winding has fourth and fifth leads pointing in a third direction, wherein the third direction is generally perpendicular to the first and second directions, and wherein the second winding is formed over and generally coaxial with the first winding;
   a transmission line formed along at least a portion of the periphery of the balun, wherein the transmission line includes a plurality of transmission line cells;
   a first conductive plane formed from at least a portion of a third metallization layer that extends over the transmission line, wherein at least a portion of the first conductive plane is electrically coupled to the transmission line;
   a second conductive plane formed from a second portion of the second metallization layer, wherein the second conductive plane extends over at least a portion of the first conductive plane, and wherein the second conductive plane is electrically coupled to the third lead;
   a first interconnect formed from a third portion of the second metallization layer, wherein the first interconnect is electrically coupled to the fourth lead; and
   a second interconnect formed from a fourth portion of the second metallization layer, wherein the second interconnect is electrically coupled to the first conductive plane and the fifth lead.

14. The apparatus of claim 13, wherein the apparatus further comprises:

a first set of vias coupled between the second interconnect and the first conductive plane; and a second set of vias coupled between the fifth lead and the second interconnect.

15. The apparatus of claim 14, wherein the first, second, and third metallization layers are formed of copper or aluminum.

16. The apparatus of claim 15, wherein the first and second set of vias are formed of tungsten.

* * * * *